United States Patent [19]

Rougeot

[11] 3,812,369

[45] May 21, 1974

[54] SOLID-STATE SEQUENTIAL SWITCHING DEVICE

[75] Inventor: Henri Rougeot, Paris, France

[73] Assignee: Thomson-CSF, Paris, France

[22] Filed: Mar. 21, 1973

[21] Appl. No.: 343,275

Related U.S. Application Data

[63] Continuation of Ser. No. 203,229, Nov. 30, 1971, abandoned.

[30] Foreign Application Priority Data

Dec. 23, 1970 France .......................... 70.46505

[52] U.S. Cl. .... 250/217 SS, 250/211 J, 250/220 M, 307/117

[51] Int. Cl. .................................... G02f 1/28

[58] Field of Search ........... 250/211 J, 209, 217 SS, 250/220 M, 217 S, 213 A; 307/117

[56] References Cited

UNITED STATES PATENTS

| | | | |
|---|---|---|---|
| 3,480,780 | 11/1969 | List et al. | 250/209 |
| 3,445,686 | 5/1969 | Rutz | 250/211 J X |
| 3,277,286 | 10/1966 | Preston, Jr. | 250/220 M X |
| 3,386,027 | 5/1968 | Kilgore et al. | 250/217 S X |
| 3,432,670 | 3/1969 | Dym | 250/211 J |

*Primary Examiner*—Walter Stolwein
*Attorney, Agent, or Firm*—Cushman, Darby & Cushman

[57] ABSTRACT

A sequential switching device using solid-state components, consisting in a bar of gallium arsenide monocrystal, in which adjacent diodes are formed, the terminals of same sign of which are arranged on the two opposite faces of the bar. These diodes, which are virtually insulators below a certain threshold voltage applied to their terminals are conductive beyond it; they emit photon radiation in the conductive condition, and, conversely, change from the insulating to the conductive condition under the effect of said photon radiation. By combining these diodes in sets of three in order to form three groups to the terminals, of which there are applied voltage pulses which succeed one another without interruption or overlap, propagation of switching along the set of diode is achieved, each diode irradiating its two neighbours, when in the conductive condition.

6 Claims, 2 Drawing Figures

PATENTED MAY 21 1974

3,812,369

Inventor

Henri Rougeot

By

Cushman, Darby + Cushman

Attorneys

SOLID-STATE SEQUENTIAL SWITCHING DEVICE

This is a continuation of application Ser. No. 203,229 filed Nov. 30, 1971, now abandoned.

The present invention relates to a sequential switching device.

The invention is based upon the properties of certain semiconductor elements, as set out hereinafter. Firstly, these elements have the property of presenting two conductive conditions, one of low conductivity the other of high conductivity, depending upon the voltage applied to them; below a certain threshold volatage V*s*, the low conductivity condition obtains and the element can virtually be considered as an insulator whilst above this threshold, the element has a high conductivity, and is a good conductor.

The same elements also have the property of emitting photon radiation when in the conductive condition and, conversely, of changing from the insulating to the conducting condition under the effect of such radiation, at a voltage below the threshold V*s*.

Elements of this kind are well-known in the semiconductor art and their properties have been described in relevant literature on the subject.

The invention exploits the combination of the two afore-stated properties to provide a sequential switching device of small size, which draws only a tiny amount of power and is simple to produce.

The invention will be better understood from a consideration of the ensuing description and the attached Figures in which.

Figure 1:
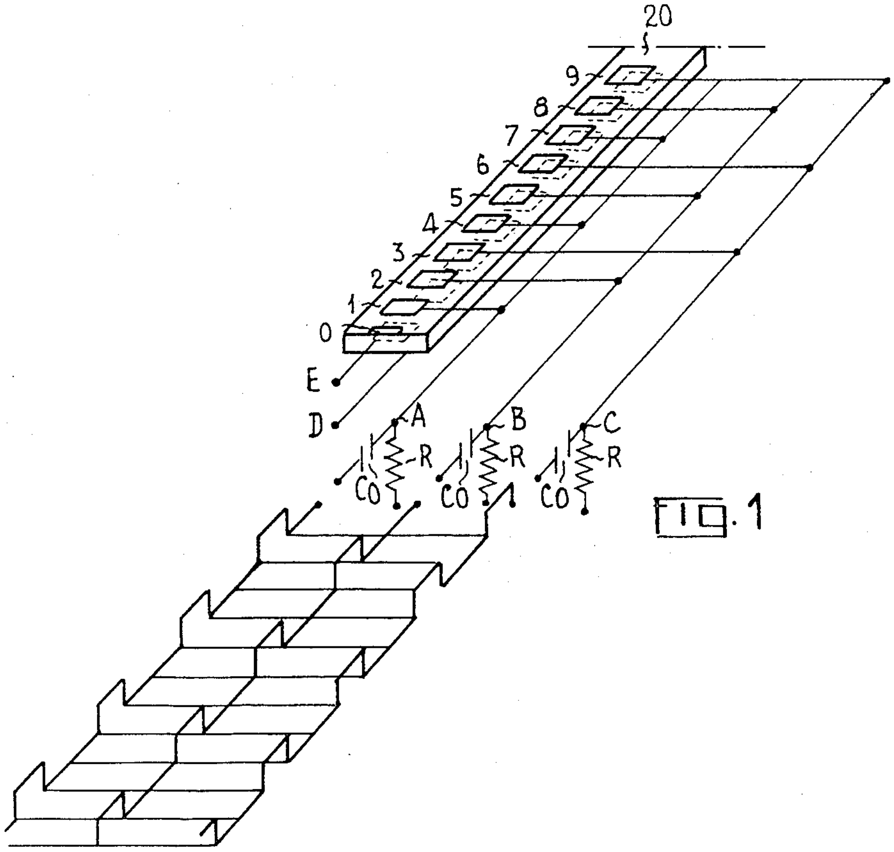
FIG. 1 is a schematic view with regard to the switching devices of the invention, accompanied by a diagram of the voltages on the leads.

FIG. 1 illustrates the succession of adjacent elements having the properties enunciated hereinbefore and forming a bar 20 upon whose top and bottom face there have been deposited metal contacts represented by unmarked squares, this in full line in the case of the top face and broken line in the case of the bottom face, in order to constitute diodes numbered 1 to 9 in respect of which these contacts form the terminals.

The contacts on one of these faces, the bottom face in the example of FIG. 1, are interconnected, connection D, whilst those on the other face, the top face here, are connected to form three groups respectively comprising the diodes 1, 4, 7, the diodes 2, 5, 8 and the diodes 3, 6, 9, respectively connected at A, B and C.

The device thus constituted makes it possible to achieve successive switching of all the diodes commencing from diodes 1.

To do this, there are applied to the points A, B, C of the three groups, through the medium of circuits $RC_0$, rectangular waveform voltage pulses of equal width, that is to say of equal duration, which are in staggered relation to one another by said same duration as indicated in the diagram at the lefthand side of FIG. 1 where the relief steps represent the pulses, the latter having a magnitude which is less than the relevant threshold.

If, for example, at a given instant, the diode 4 is in the conductive condition, then in accordance with the foregoing explanation it will emit photon radiation which is applied to the two neighbouring diodes 3 and 5, the diodes 2 and 6 by contrast being shielded from this radiation because of the presence of the diodes 3 and 5.

When one of the voltage pulses applied at the points A, B, C appears across the terminals of the diode 5, the latter, subject to the radiation coming from the diode 4, changes to the conductive condition whilst the diode 2, although also subjected to the influence of this pulse, is too far from the diode 4 to receive the radiation and therefore remains in the insulating condition.

After the triggering of the diode 5, the voltage pulse applied to the diode 4 disappears because of the phase-shift existing between the pulses applied to the groups A, B, C; only the diode 5 is then conductive; it, in turn, irradiates the diodes immediately adjacent it, that is to say the diodes 4 and 6, this to the exclusion of all the others which are too far away. When the voltage signal applied to the diode 5 ceases, the signal applied to the diode 6 appears, this diode in turn triggering into the conductive condition.

The procedure is repeated step by step, successively rendering each of the diodes to the set conductive. When this has happened, it is necessary to trigger the switching operation again. This renewed triggering is effected by means of the diode O, similar to the others but connected, by the terminals D and E, to a generator which produces between the terminals D and E pulses of an amplitude in excess of the threshold beyond which a change from the insulating to the conductive condition takes place (as mentioned herein-before).

The device in accordance with the invention thus provides a means of effecting switching along a line in a given direction and at a rate which can be regulated by the width of the pulses applied to the groups A, B and C.

It goes without saying that the same process would take place, if, instead of successively applying pulses of equal width each offset in relation to one another by said width to the three points A, B and C, one were to apply in a general way, to said points, successive pulses of equal width but each offset this time in relation to the former by the width of the latter, in other words arbitrary pulses which succeed one another without interruption.

It is equally possible to control several different switching operations with the same device, triggering each of them through the diode O, at the desired instant.

Finally, using the diode O it is also possible to interrupt the switching process before reaching the last of the diodes and to restart a new one through said same diode O.

It goes without saying that several devices of the kind shown in FIG. 1 could be associated with one another.

In accordance with the invention, the device described schematically hereinbefore, and illustrated in FIG. 1, is designed in the following fashion and in the manner shown in the embodiment of FIG. 2 conventionally restricted to seventeen diodes.

A monocrystalline wafer of gallium arsenite 20, oxygen doped for example, although it could equally well be doped with chromium, iron, zinc or some other known impurity which will render the material semi-insulating by the compensation of its majority impurities, is cut to a thickness of around 100 $\mu$m, a width of 5mm and a length which depends upon the number of diodes to be produced; for example for 500 diodes of 40 $\mu$m sidelength each, spaced at 10 $\mu$m intervals, a length of 25 mm would be suitable.

After polishing and finishing, there are deposited upon the two faces of the wafer, by some suitable known method or other, two sets of metal contacts. These contacts will for example take the form of squares, of which only those deposited upon the top face are visible in the example of FIG. 2. On one of the faces of the wafer, the top face in the embodiment of FIG. 2, the diodes are grouped three by three in the manner shown in this figure and as indicated hereinafter.

First of all, through leads $l_1$ produced by vaporisation, the diodes 1, 4, 7 . . . are connected to a metal strip $A_1$ deposited upon the wafter 20 by one of the known techniques; then there is deposited upon the wafer 20 an insulating layer 21 of some few $\mu$m in thickness which is stepped back from the edge of the wafer 20. On this layer, as before, a metal strip B1 is deposited and there are connected to it by the vaporised deposition of conductors $l_2$, diodes 2, 5, 8 . . . Finally, a second insulating layer 22, stepped back from the first, is deposited and on this, in turn, a metal strip C1 which is connected as before to the diodes 3, 6, 9 . . . by conductors $l_3$.

The layers $A_1$, $B_1$, $C_1$ are respectively connected to the points A, B, C of the foregoing Figure, whilst the terminals of all the diodes located on the other face of the wafer 20, interconnected with one another, are taken to the point D.

The diode O at the end of the wafer 20 is connected, as in the case of FIG. 1, to the terminals D and E of the trigger circuit. The lines l represent the diode leads and are connected by some suitable prior art method to each of the channels of the load circuit whose other terminal is taken to the point D.

Figure 2:
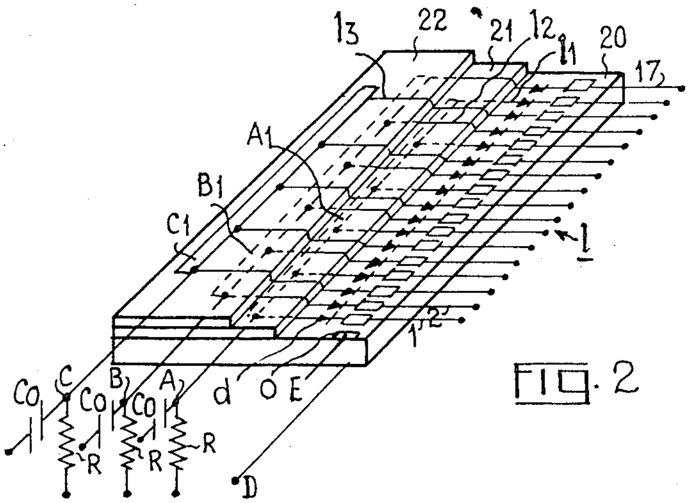
FIG. 2 is an embodiment of a switch in accordance with the invention.

The function of the rectifier *d*, shown in FIG. 2, is to prevent the parallel connection, to the switched channel, of the diodes connected to the same group as that containing the diode of the switched channel.

Of course, the invention is not limitated to the embodiment described and shown which was given solely by way of example.

What is claimed is:

1. A device for switching the channels of a multichannel circuit, made up of semiconductor diodes having the dual property of being conductive beyond a certain threshold voltage applied to their terminals and insulating below said threshold, and of emitting photon radiation in the conductive condition and, conversely, of changing from the insulating condition to the conductive condition under the effect of said radiation when the voltage applied to their terminals is beyond a given value lower than said threshold, comprising a series of such diodes located side-by-side in a row, inserted in said channels, their terminals of a first one polarity interconnected with one another and their terminals of a second other polarity being, the first one, fourth, seventh, etc., the second one, fifth, eighth, etc., the third one, sixth, ninth, etc., respectively connected to sources of voltage for supplying these terminals with regard to the first mentioned terminals with voltage pulses whose magnitude is higher than said given value and less than said threshold value and which succeed one another without interruption or overlap, the photon radiation emitted by each of said diodes, when in radiation emitting condition, irradiating the diodes immediately adjacent it in the row, to the exclusion of all the others, said device further comprising a diode whose terminals have applied in operation a voltage in excess of said threshold and located at the extremity of the row, so as to irradiate the diode of said series of diodes which is adjacent it, thereby irradiating the first diode of said row and making said switching to propagate from channel to channel.

2. A switching device as claimed in claim 1, characterized in that said voltage pulses are rectangular waveform pulses, identical with one another and having a periodicity of T, a duration of T/3, each pulse being delayed in relation to the preceding one by T/3.

3. A switching device as claimed in claim 1, characterized in that each of said diodes consists of a semi-insulating gallium arsenide monocrystal.

4. A switching device as claimed in Claim 1, characterized in that said diodes are parts of a single semi-insulating gallium arsenide monocrystal.

5. A switching device as claimed in claim 4, characterized in that said monocrystal is bar-shaped and in that said terminals of one sign are provided on one face of the bar and the terminal of the other sign on the opposite side.

6. A switching device as claimed in claim 1, characterized in that it comprises several bars of the kind claimed in claim 5.

* * * * *